(12) United States Patent
Gordon et al.

(10) Patent No.: US 7,589,971 B2
(45) Date of Patent: Sep. 15, 2009

(54) RECONFIGURABLE HEAT SINK ASSEMBLY

(75) Inventors: David Scott Gordon, Hillsboro, ND (US); Michael Ray Schlichtmann, Fargo, ND (US); Brian Frederick Boeshans, Fargo, ND (US); Jon Thomas Jacobson, Fargo, ND (US)

(73) Assignee: Deere & Company, Moline, IL (US)

( * ) Notice: Subject to any disclaimer, the term of this patent is extended or adjusted under 35 U.S.C. 154(b) by 259 days.

(21) Appl. No.: 11/545,635

(22) Filed: Oct. 10, 2006

(65) Prior Publication Data

US 2008/0084672 A1    Apr. 10, 2008

(51) Int. Cl.
*H05K 7/20* (2006.01)
*F28F 7/00* (2006.01)
*H01L 23/34* (2006.01)

(52) U.S. Cl. ............... 361/710; 361/704; 361/714; 165/185; 165/80.2; 174/16.3; 257/712; 257/713

(58) Field of Classification Search ........... 361/704, 361/707, 709, 710, 715, 717, 719; 165/80.2, 165/185; 174/16.3; 257/713, 712

See application file for complete search history.

(56) References Cited

U.S. PATENT DOCUMENTS

| | | | |
|---|---|---|---|
| 4,442,450 A | | 4/1984 | Lipschutz et al. |
| 4,479,140 A * | 10/1984 | Horvath ............... 257/713 |
| 4,607,277 A * | 8/1986 | Hassan et al. ............... 257/713 |
| 4,639,829 A * | 1/1987 | Ostergren et al. ............ 361/718 |
| 4,770,242 A * | 9/1988 | Daikoku et al. ............. 165/185 |
| 5,005,638 A | | 4/1991 | Goth et al. |
| 5,251,098 A | | 10/1993 | Schmidt |
| 5,455,457 A | | 10/1995 | Kurokawa |
| 5,754,401 A * | 5/1998 | Saneinejad et al. .......... 361/705 |
| 5,808,236 A | | 9/1998 | Brezina et al. |
| 5,829,512 A | | 11/1998 | August |
| 5,964,285 A * | 10/1999 | Huang ......................... 165/185 |
| 5,999,407 A | | 12/1999 | Meschter et al. |
| 6,064,573 A | | 5/2000 | Morton |
| 6,069,023 A | | 5/2000 | Bernier et al. |
| 6,365,964 B1 * | 4/2002 | Koors et al. .................. 257/718 |
| 6,404,638 B1 | | 6/2002 | Messina |
| 6,708,757 B2 | | 3/2004 | Hebel et al. |
| 6,816,377 B2 * | 11/2004 | Itabashi et al. ............. 361/704 |
| 6,819,562 B2 | | 11/2004 | Boudreaux et al. |
| 7,023,699 B2 * | 4/2006 | Glovatsky et al. ........... 361/704 |
| 7,362,583 B2 * | 4/2008 | Refai-Ahmed et al. ...... 361/719 |
| 2003/0169983 A1 | | 9/2003 | Branch et al. |
| 2005/0190540 A1 | | 9/2005 | Shearman et al. |

FOREIGN PATENT DOCUMENTS

JP    2004-278209    * 10/2004

* cited by examiner

*Primary Examiner*—Jayprakash N Gandhi
*Assistant Examiner*—Zachary M Pape

(57) ABSTRACT

An electrical assembly including a housing having an inner surface. At least one mounting feature protrudes from the inner surface. At least one heat sink is inserted onto the at least one mounting feature. At least one electrical component is in thermal contact with a portion of the at least one heat sink.

11 Claims, 3 Drawing Sheets

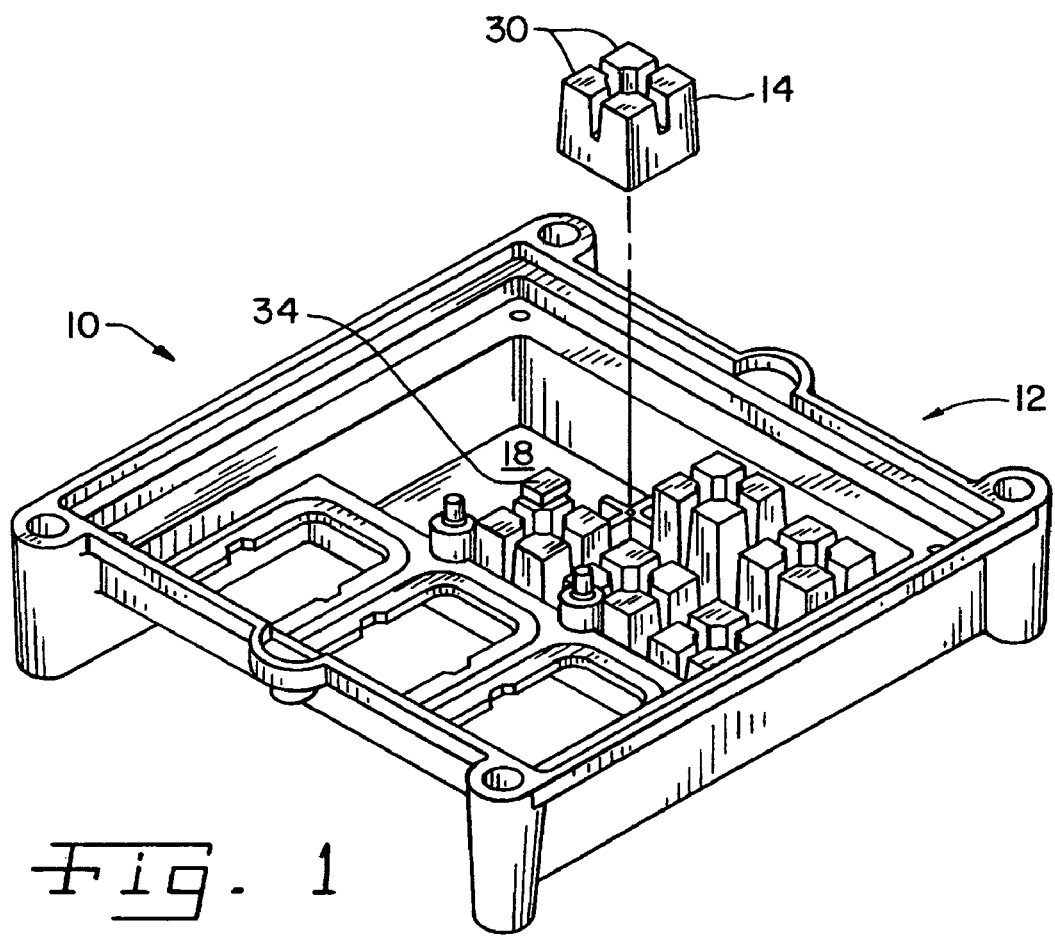
Fig. 1
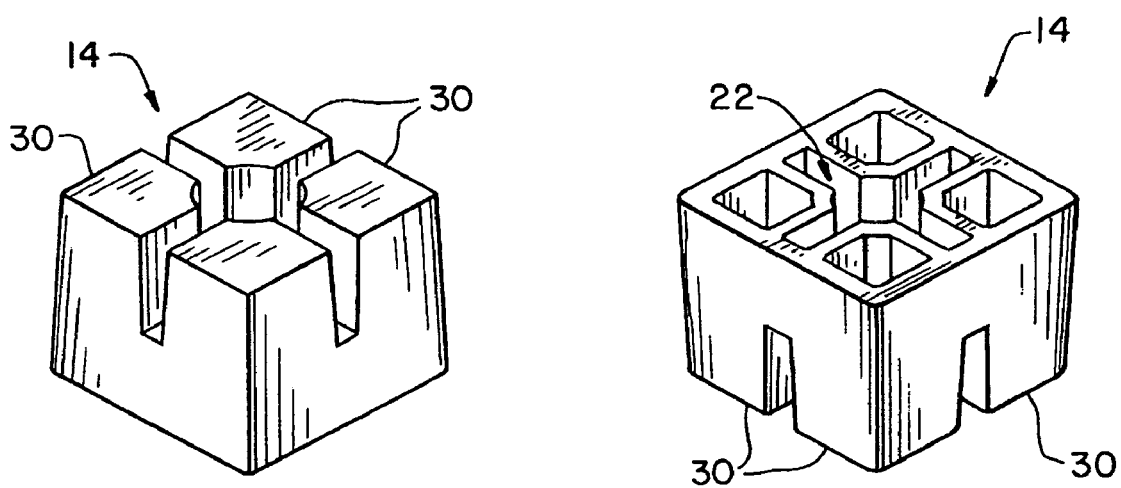
Fig. 2
Fig. 3

RECONFIGURABLE HEAT SINK ASSEMBLY

FIELD OF THE INVENTION

The present invention relates to an electrical assembly, and, more particularly to an electrical assembly with a heat sink.

BACKGROUND OF THE INVENTION

Electrical assemblies produce heat that must be dissipated from the circuitry to allow the electrical components to operate within a preferred temperature range. High power electrical components are often directly mounted to a heat sink that thermally conducts the heat to another place for dissipation. The dissipation of the heat often is by way of convection or radiation methods. Additionally, cooling fans may be incorporated to enhance the convection cooling of the assembly. The sophistication of electrical circuitry has increased and more electronic features are positioned in smaller spaces, thereby requiring the conduction of heat from the circuitry. In some cases liquid coolants are used to cool the electrical components to remove the heat therefrom.

Heat sink design is customized to accommodate the electrical circuitry, thereby requiring unique heat sinks for each electrical assembly. This leads to a great investment in the original design and when the electrical functions are changed this often leads to a need to replace the entire heat sink.

What is needed in the art is a flexible heat sink assembly method to reduce the obsolescence of housing heat sink assemblies.

SUMMARY OF THE INVENTION

The present invention provides a reconfigurable heat sink assembly.

The invention comprises, in one form thereof, an electrical assembly including a housing having an inner surface. At least one mounting feature protrudes from the inner surface. At least one heat sink is inserted onto the at least one mounting feature. At least one electrical component is in thermal contact with a portion of the at least one heat sink.

BRIEF DESCRIPTION OF THE DRAWINGS

FIG. 1 is an exploded perspective view of an embodiment of a heat sink assembly of the present invention;

FIG. 2 is a perspective view of a mobile heat sink utilized in the assembly of FIG. 1;

FIG. 3 is another view of the mobile heat sink of FIGS. 1 and 2;

DETAILED DESCRIPTION OF THE INVENTION

Figure 4:
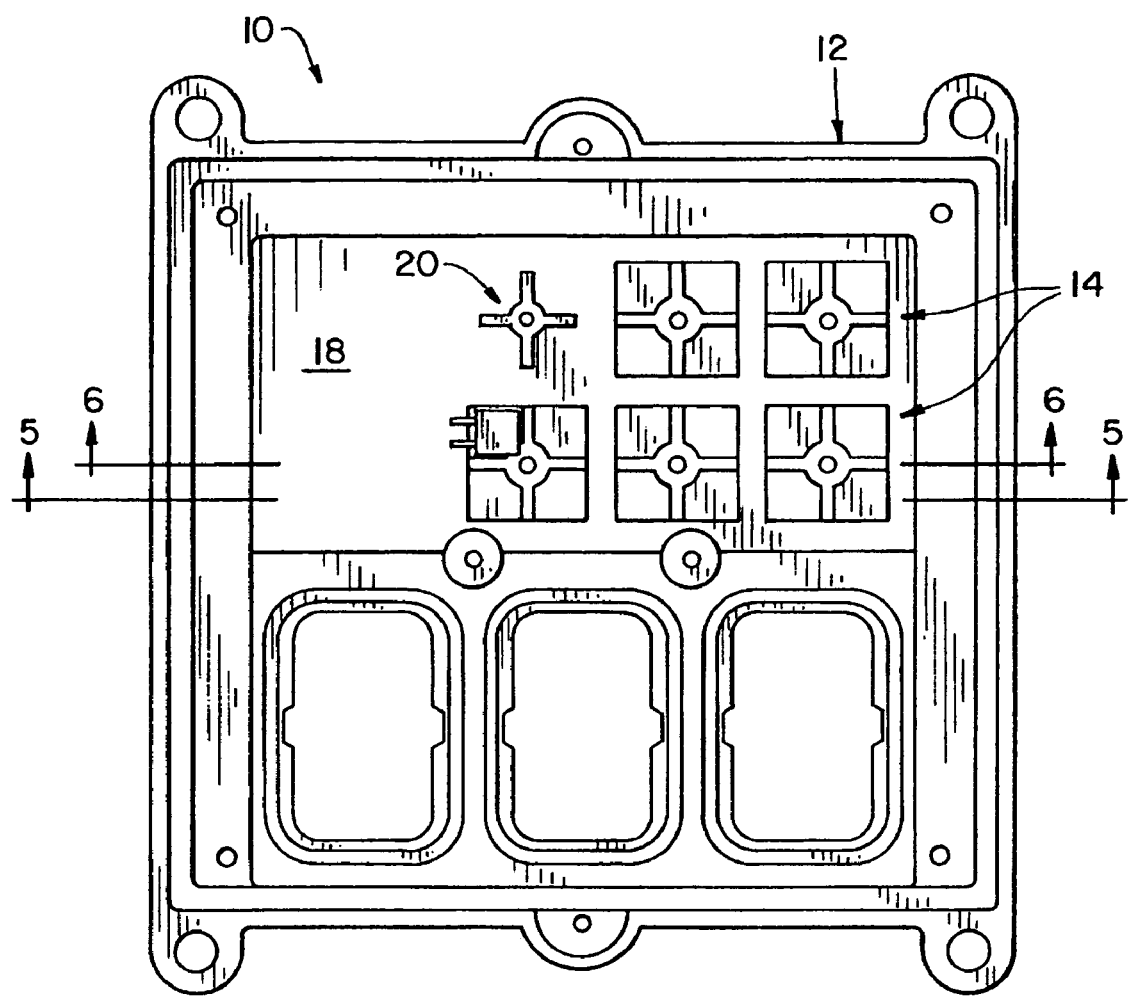
FIG. 4 is a top view of the heat sink assembly of FIG. 1 with mobile heat sinks of FIGS. 2 and 3 installed therein.

Referring now to the drawings, and more particularly to FIGS. 1-4, there is shown an assembly 10 including a housing 12, modular heat sinks 14 and an electrical circuit assembly 16. Assembly 10 includes a mixture of electrical and mechanical components. Housing 12 is in thermal contact with modular heat sinks 14 that are mounted thereto. Electrical circuit assembly 16, which can be a printed circuit assembly 16, has various electrical components thereon, which come into contact with a surface of modular heat sinks 14.

Housing 12, which may be part of an electrical enclosure, includes an inner surface 18 from which protrusions 20 extend outwardly. Inner surface 18 is made of a thermal conductive material allowing heat to be dissipated to other surfaces of housing 12 for the removal of heat therefrom. Protrusions 20, also known as mounting features 20 extend from inner surface 18 and are illustrated as a cross-type protrusion having extensions that extend outwardly as 90° separated fingers. Alternatively housing 12 may be an open assembly that does not fully enclose electrical circuit assembly 16.

Modular heat sinks 14 include receiving slots 22 that interact with mounting features 20 to locate and orient modular heat sinks 14 when installed in housing 12. Receiving slots 22 and mounting features 20 interact to allow modular heat sinks 14 to be positioned in four separate orientations. As illustrated, modular heat sinks 14 can be positioned at any of the locations of a specific mounting feature 20 without altering the height of any contacting surface. Modular heat sinks 14 envelop mounting features 20, when installed thereon. However, it is within the realm of the present invention to also have modular heat sinks 14 with different shaped or height protrusions extending therefrom.

Figure 5:
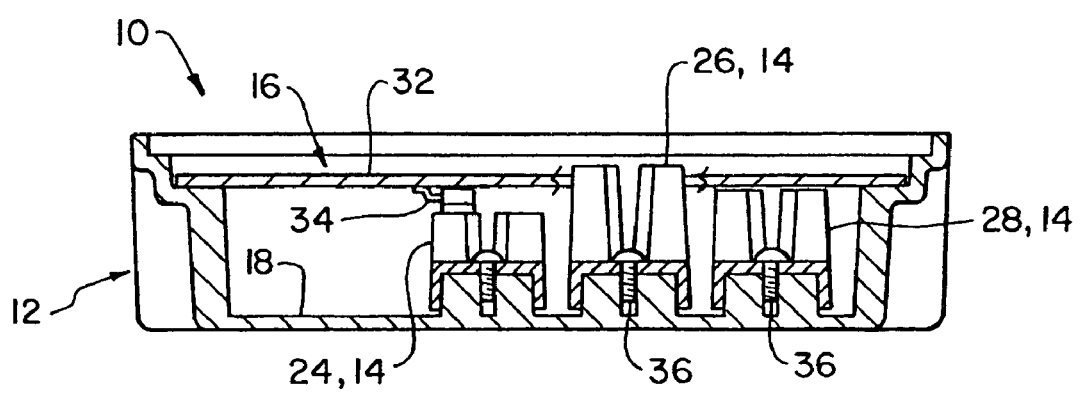
FIG. 5 is a cross-sectional view taken along lines 5-5 of FIG. 4.
Figure 6:
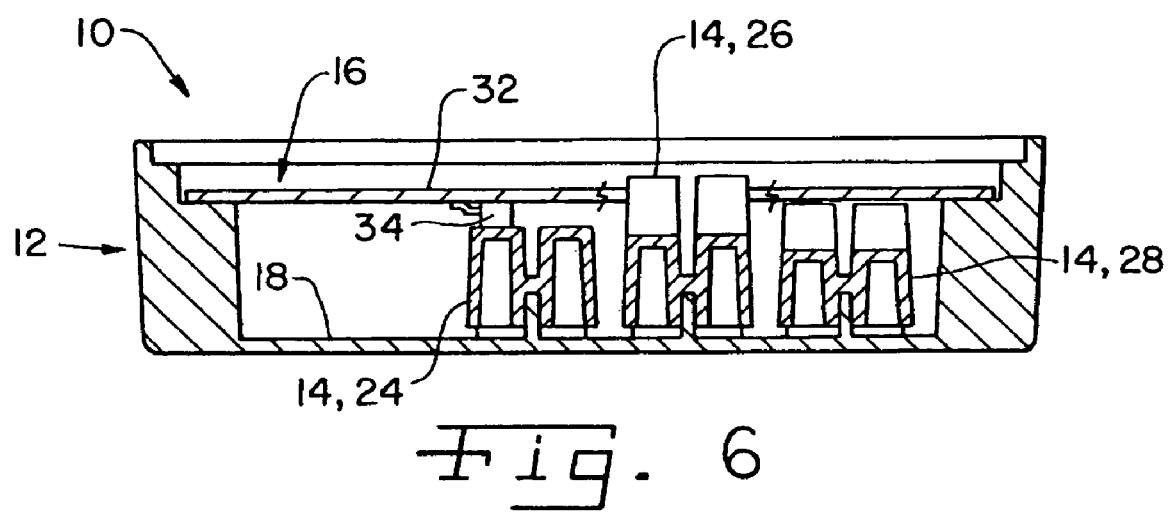
FIG. 6 is another cross-sectional view taken along lines 6-6 of FIG. 4.

Now, additionally referring to FIGS. 5 and 6, there are illustrated modular heat sinks 14 including a first modular heat sink 24, a second modular heat sink 26 and a third modular heat sink 28. Heat sink 24 has a height that is shorter than the height of heat sinks 26 and 28. Heat sink 26 is illustrated as being the tallest heat sink, even extending through printed circuit board assembly 16. Heat sink 28 extends to and touches printed circuit board 16 and may conduct heat from the circuit board itself or a component on the opposite side of printed circuit board assembly 16, the component not being illustrated. Protrusions 30 of heat sinks 24, 26 and 28 extend away from inner surface 18. Protrusions 30 make contact with printed circuit board 32 or directly contact an electrical component 34, of printed circuit board assembly 16.

Screws 36 extend through holes in modular heat sinks 14 and hold heat sinks 14 to housing 12. Screws 36, even though illustrated as only holding heat sink 14 to housing 12, could extend through printed circuit board 32 to hold electrical components 34 tightly against a surface of heat sink 14.

Heat sink 26 allows components that may be electrically connected to printed circuit board 32 to come in direct contact with heat sink 14 from an opposite side of board 32 that faces away from inner surface 18.

Modular heat sinks 14 are basically incompressible and are generally solidly mounted to housing 12. Modular heat sinks 14 are internally located in position thereby establishing criteria that can be utilized by a replacement printed circuit board assembly 16 that may be configured other than the one shown. This allows housing 12 to be reutilized with a different printed circuit board assembly with modular heat sinks 14 being reconfigured to match the surface topography of the new printed circuit board assembly. Heat sinks 14 may be made from the same material as housing 12 or may be made of other thermally conductive material compatible therewith. When a new printed circuit board assembly is desired the localized heat conducting capabilities are known so that the positioning of components on the printed circuit board assembly can be coordinated with the locations of heat sinking capability that can be attached to housing 12.

The present invention is directed to a housing 12 for the mounting of electrical component assemblies, which have heat removed therefrom and conducted by way of heat sinks 14. Mounting features 20 are geometrical features 20 that are placed on a surface of housing 12 to interact with accommodating mating features in heat sinks 14. While features 20 are shown as a protrusion other indexing features, such as indentations are also contemplated. The position of features 20 establishes where heat sinks 14 may be located. Features 20 are used to orient heat sinks 14 to establish surfaces to conduct heat that are located apart from feature 20. The surfaces may be shaped to accommodate the shape of individual electrical components or assemblies. The heat sinks have thermal conductive properties for the conduction of heat from the electrical components. Positioning of the heat sinks allows for easy modification of the assembly. For example, when a new circuit design is to be introduced that will use the same housing as a former circuit, then the location of features 20 is part of the design criteria of the electrical assembly. In the design of the new electrical assembly the location of the heat sinks, which is established by features 20 is known, and the heights of the heat sinks to be located at selected features 20 can then be specified as a part of the design process. The selection of different height heat sinks 14 can then be selectively placed pursuant to the design for the mounting of the new circuit assembly. The removable heat sinks are reusable and allow for a reconfiguring of three dimensional space in a housing for the selective placement of heat conducting structures.

Having described the preferred embodiment, it will become apparent that various modifications can be made without departing from the scope of the invention as defined in the accompanying claims.

The invention claimed is:

1. An electrical assembly comprising:
    a housing having an inner surface;
    at least one cross-shaped mounting feature protruding from said inner surface;
    at least one heat sink inserted onto said at least one mounting feature;
    a threaded fastener for removably connecting the at least one heat sink to the at least one mounting feature; and
    at least one electrical component in thermal contact with a portion of said at least one heat sink, where said at least one heat sink has a plurality of protrusions that extend away from said inner surface of said housing and where said at least one heat sink has a symmetry that allows said at least one heat sink to be connected to said mounting feature in four positions about an axis orthogonal to said inner surface of said housing.

2. The electrical assembly of claim 1, wherein said at least one heat sink is basically incompressible or incapable of being compressed.

3. The electrical assembly of claim 1, wherein said at least one mounting feature includes a first mounting feature and a second mounting feature, said at least one heat sink including a first heat sink and a second heat sink, said first heat sink being inserted onto said first mounting feature, said second heat sink being inserted onto said second mounting feature.

4. The electrical assembly of claim 3, wherein said first heat sink has a first height and said second heat sink has a second height, said first height being different than said second height.

5. The electrical assembly of claim 3, wherein said first heat sink is adjacent to said second heat sink.

6. The electrical assembly of claim 1, wherein said at least one heat sink has inner surfaces that locate said at least one heat sink relative to said inner surface of said housing based on corresponding features of said at least one mounting feature.

7. An electrical enclosure comprising:
    a housing having at least one cross-shaped protrusion extending from an inner surface of said housing;
    at least one heat sink inserted onto said at least one cross-shaped protrusion;
    a threaded fastener for removably connecting the at least one heat sink to the at least one cross-shaped protrusion; and
    at least one electrical component in thermal contact with a portion of said at least one heat sink, where said at least one heat sink has a plurality of protrusions that extend away from said inner surface of said housing and where said at least one heat sink has a symmetry that allows said at least one heat sink to be connected to said protrusion in four positions about an axis orthogonal to said inner surface of said housing.

8. The electrical enclosure of claim 7, wherein said at least one protrusion includes a first protrusion and a second protrusion, said at least one heat sink including a first heat sink and a second heat sink, said first heat sink being inserted onto said first protrusion, said second heat sink being inserted onto said second protrusion.

9. The electrical enclosure of claim 8, wherein said first heat sink has a first height and said second heat sink has a second height, said first height being different than said second height.

10. The electrical enclosure of claim 8, wherein said first heat sink is adjacent to said second heat sink.

11. The electrical enclosure of claim 7, wherein said at least one heat sink has inner surfaces that locate said at least one heat sink relative to said inner surface of said housing based on corresponding features of said at least one protrusion.

* * * * *